United States Patent
Li (10) Patent No.: US 9,520,461 B1
(45) Date of Patent: Dec. 13, 2016

(54) INTEGRATED CIRCUIT WITH LATERAL FLUX CAPACITOR

(71) Applicant: Texas Instruments Incorporated, Dallas, TX (US)

(72) Inventor: Zhi-Qi Li, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/839,684

(22) Filed: Aug. 28, 2015

(51) Int. Cl.
| | | |
|---|---|---|
| *H01L 49/02* | (2006.01) | |
| *H01L 23/522* | (2006.01) | |
| *H01L 21/768* | (2006.01) | |
| *H01L 27/06* | (2006.01) | |

(52) U.S. Cl.
CPC ............ *H01L 28/86* (2013.01); *H01L 21/768* (2013.01); *H01L 23/5226* (2013.01); *H01L 27/0629* (2013.01)

(58) Field of Classification Search
CPC .... H01L 28/86; H01L 21/768; H01L 23/5226; H01L 27/0629
USPC ........................................................ 257/534
See application file for complete search history.

(56) References Cited

U.S. PATENT DOCUMENTS

| | | | |
|---|---|---|---|
| 6,084,285 A | 7/2000 | Shahani et al. | |
| 6,728,942 B2* | 4/2004 | Lampaert | G06F 17/5068 |
| | | | 716/102 |
| 7,348,624 B2* | 3/2008 | Sakaguchi | H01L 23/5223 |
| | | | 257/296 |
| 8,169,014 B2* | 5/2012 | Chen | H01L 23/5223 |
| | | | 257/306 |

OTHER PUBLICATIONS

Aparicio, Roberto; "Capacity Limits and Matching Properties of Integrated Capacitors," IEEE Journal of Solid-State Circuits, vol. 37, No. 3, Mar. 2002,10 pages.

* cited by examiner

*Primary Examiner* — Yasser A Abdelaziez
(74) *Attorney, Agent, or Firm* — Tuenlap D. Chan; Frank D. Cimino (57) ABSTRACT

An integrated circuit has a lateral flux capacitor assembly that includes a first metal layer having a capacitive portion with first and second lateral sides and first and second capacitive fingers, a first dummy metal lines portion positioned adjacent the first lateral side of the capacitive portion and a second dummy metal lines portion positioned adjacent the second lateral side of the capacitive portion. The first set of capacitive fingers is electrically connected to the first dummy metal lines portion and the second set of capacitive fingers is electrically connected to the second dummy metal lines portion. A method of making an integrated circuit assembly with a lateral flux capacitor includes electrically connecting a first plurality of capacitive fingers in a first metal layer to a first dummy metal lines portion of the first metal layer.

12 Claims, 9 Drawing Sheets

| 501 | ELECTRICALLY CONNECTING A FIRST PLURALITY OF CAPACITOR FINGERS IN A FIRST METAL LAYER TO A FIRST DUMMY METAL LINES PORTION OF THE FIRST METAL LAYER |

FIG. 13

INTEGRATED CIRCUIT WITH LATERAL FLUX CAPACITOR

BACKGROUND

Lateral flux capacitors are passive circuit devices that may be formed on a top surface of an integrated circuit die. Such lateral flux capacitors are connected to circuitry within the die to provide desired capacitor functions. One type of integrated circuit die that may have a lateral flux capacitor formed thereon is a linear bipolar CMOS ("LBC") die.

SUMMARY

A lateral flux capacitor assembly, in one embodiment, includes an elongate capacitive portion having a lower metal layer with a first set of spaced apart capacitive fingers and an upper metal layer with a second set of spaced apart capacitive fingers positioned directly above corresponding ones of the first set of spaced apart capacitive fingers. The assembly also includes first and second elongate dummy metal lines portions positioned on opposite lateral sides of the elongate capacitive portion. The first elongate dummy metal lines portion is electrically connected to a first pole of a power source. The first set of capacitive fingers and the second elongate dummy metal lines portion are electrically connected to a second pole of the power source and the second set of capacitive fingers.

In another embodiment, a lateral flux capacitor assembly includes a first metal layer having at least a first and second set of parallel capacitive fingers and first and second dummy metal line portions and first and second hand portions. The capacitor assembly includes a second metal layer having at least a first and second set of parallel capacitive fingers and first and second dummy metal line portions and first and second hand portions. The first and second sets of parallel capacitive fingers in the first metal layer are positioned in mirror image relationship with the first and second sets of parallel capacitive fingers in the second metal layer. The sets of capacitive fingers positioned in mirror image relationship have opposite polarities. The first and second dummy metal line portions in the first metal layer are positioned in mirror image relationship with the first and second dummy metal line portions in the second metal layer. The first and second hand portions in each metal layer electrically connect capacitive fingers attached thereto to an associated dummy metal line portion. The first hand portions in the first and second metal layers and the second hand portions in the first and second metal layers partially overlap.

In another embodiment, a lateral flux capacitor assembly includes a first metal layer having a capacitive portion with first and second lateral sides and first and second capacitive fingers, a first dummy metal lines portion positioned adjacent the first lateral side of the capacitive portion and a second dummy metal lines portion positioned adjacent the second lateral side of the capacitive portion. The first set of capacitive fingers is electrically connected to the first dummy metal lines portion and the second set of capacitive fingers is electrically connected to the second dummy metal lines portion.

A method of making a lateral flux capacitor includes electrically connecting a first plurality of capacitive fingers in a first metal layer to a first dummy metal lines portion of the first metal layer.

DETAILED DESCRIPTION

Figure 1:
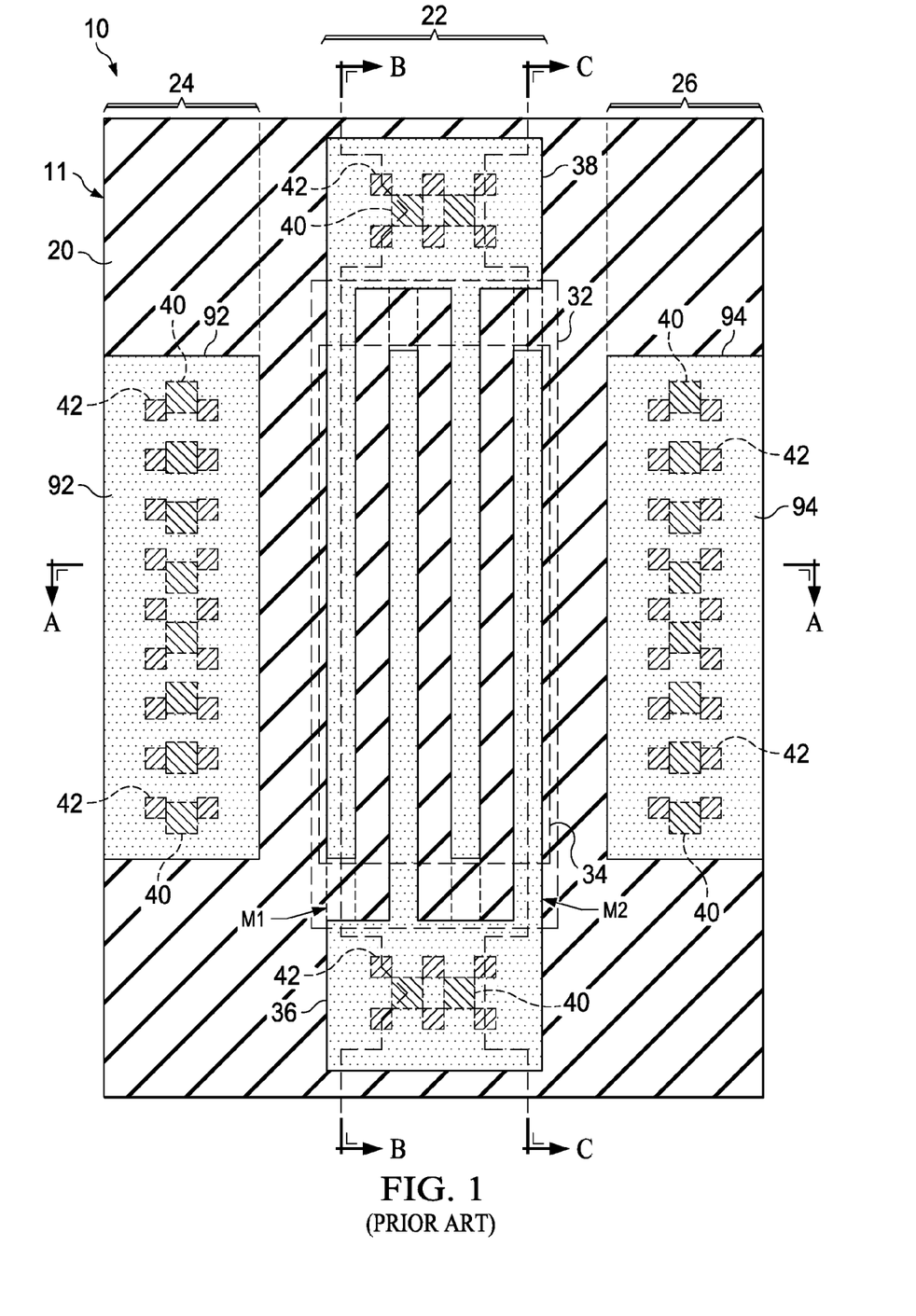
FIG. 1 is a top plan view of a conventional lateral flux capacitor structure of an integrated circuit die.
Figure 2:
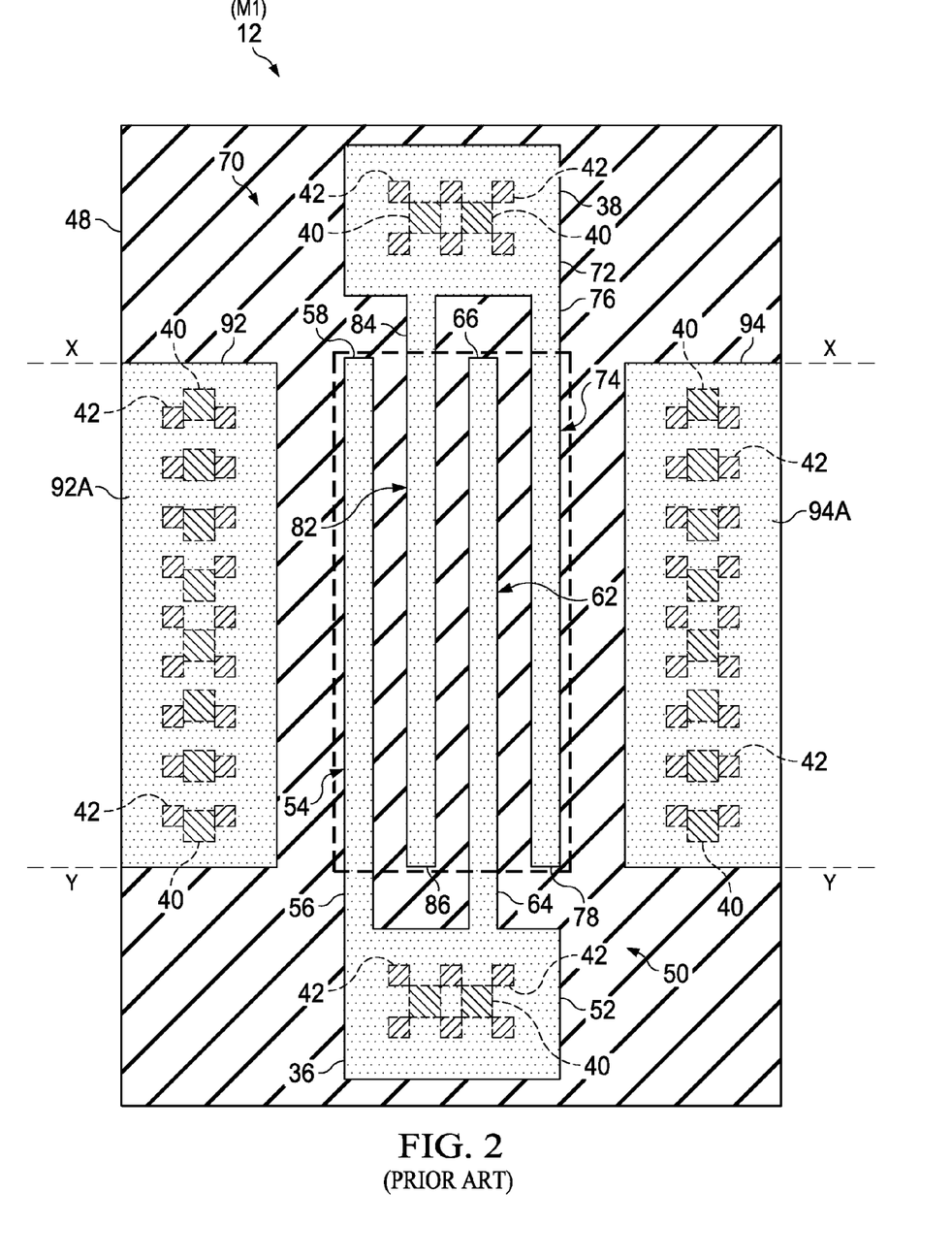
FIG. 2 is a top plan view of a first metal layer (M1) of the lateral flux capacitor structure of FIG. 1.
Figure 3:
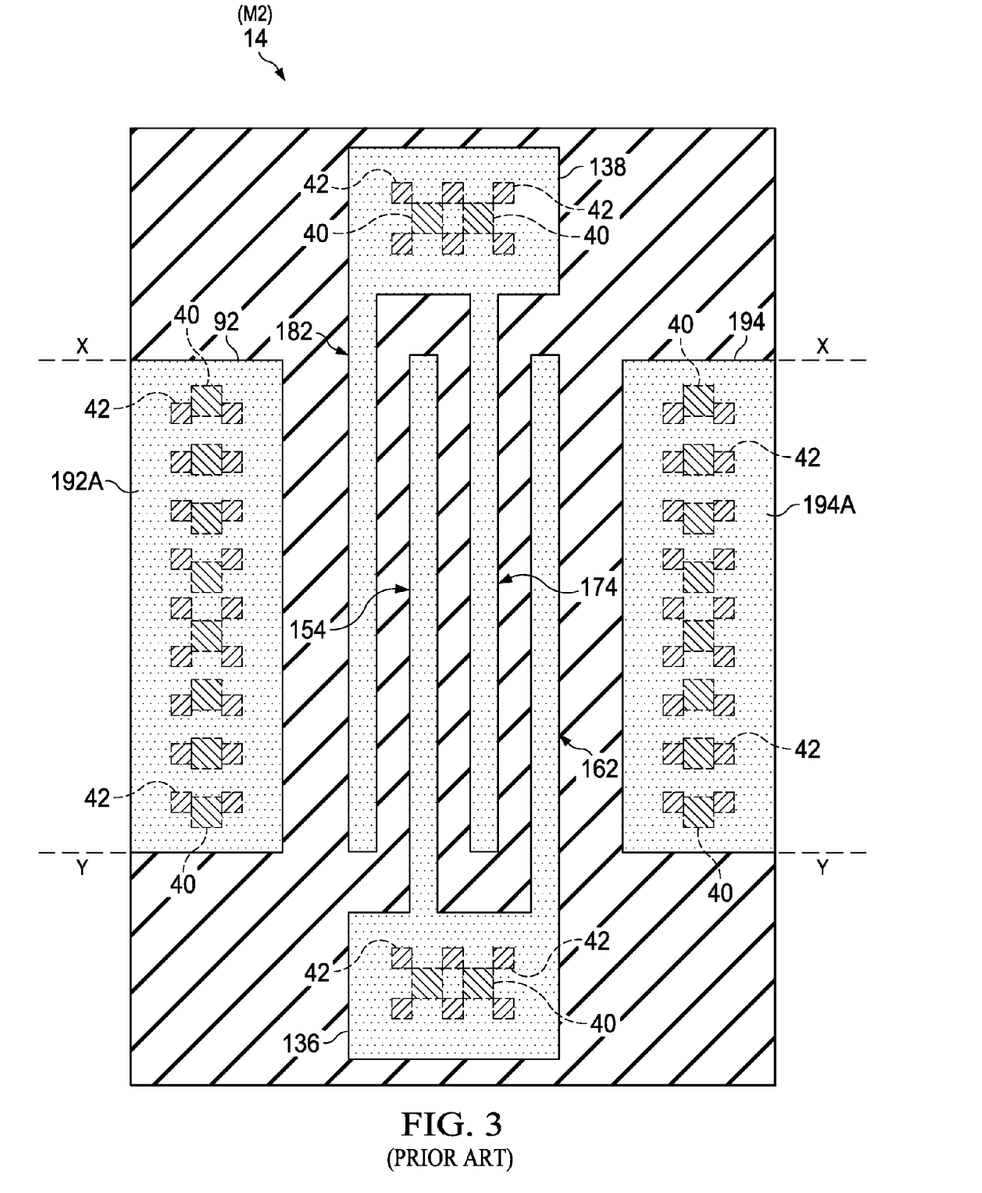
FIG. 3 is a top plan view of a second metal layer (M2) of the lateral flux capacitor structure of FIG. 1.

FIG. 1 is a top plan view of a conventional lateral flux capacitor structure 10 formed on a portion of a semiconductor (e.g. silicon) die 11. FIGS. 2 and 3 are top plan views of the bottom and top metal layers (M1) and (M2), respectively, of the flux capacitor structure 10 of FIG. 1, and FIGS. 4-6 are cross sectional views thereof. The lateral flux capacitor structure 10 includes a first or lower (M1) metal layer 12, FIG. 2, a second or top (M2) metal layer 14, FIG. 3, positioned above the M1 layer 12, and an insulating (I1) layer 16, FIGS. 4-6, positioned between the M1 and M2 layers 12, 14. It should be noted that each of the metal layers 12 (M1) and 14 (M2) are referred to as metal layers because of metal patterns formed therein. Each "metal layer" also includes an insulation/dielectric portion that covers the space within the layer that is not part of the metal pattern of the layer.

As shown by FIG. 1, the die 11 has a top semiconductor surface 20 on which are located: a laterally central interdigitated capacitor region 22; a first dummy metal lines region 24 on a first lateral side of the capacitor region 22; and a second dummy metal lines region 26 on a second lateral side of the capacitor region 22. It is to be understood that the various lateral regions 22, 24, 26, for purposes of description, are to be interpreted as projecting vertically through each of the metal layers 12 (M1), 14 (M2).

The interdigitated capacitor region 22, FIG. 1, includes a finger area 32, where all of the capacitive fingers (described below) are located. A finger overlap or core area 34 is located within the finger area 32 and is the area in which fingers in the top (M2) layer 14, FIG. 3, overlap with fingers in the lower (M1) layer 12, FIG. 2. This core area 34 is the effective capacitance area for this configuration. The fingers in the bottom and top layer 12, 14 do not overlap except in area 34.

The interdigitated capacitor region 22 also includes a first connection tab area 36 located at one longitudinal end of the capacitor region 22 and a second connection tab area 38 located at the other longitudinal end of the capacitor region 22. Each of the connection tab areas 36, 38 in the illustrated embodiment have two filled vias 40 extending vertically therethrough, which connect connection tabs 36, 38 in the bottom M1 layer 12, FIG. 2, to overlying connection tabs 136, 138, respectively, in the M2 layer 14, FIG. 3. Each of the bottom connection tabs 36, 38 also have, as shown by dotted lines in FIG. 1, six filled vias 42 that connect them to a bottom (zero) metal layer (M0), FIG. 4, through a bottom (zero) insulating layer (I0). The bottom metal layer (M0) and the bottom insulating layer (I0) are not shown, except in FIG. 4. A power source (not shown) is electrically connected to each set of the stacked connection tab stacks 36, 136; 38, 138, and is the power source that produces magnetic fields having lateral flux lines (not shown) that extend between each pair of upper and lower overlapping fingers, which are described further below.

As previously mentioned, the dummy metal line regions 24, 26 shown in FIG. 1 are lateral regions of the lateral flux capacitor structure 10 located on either side of the laterally central interdigitated capacitor region 22. The dummy metal line region 24 contains a rectangular area 92 and the dummy metal line region 26 contains a rectangular area 94. The first and second rectangular areas 92, 94, shown in FIG. 1, comprises rectangular metal areas 92A, 94A in the M1 layer shown in FIG. 2. which may be formed, for example, by patterning and etching or other means known in the art. The metal layers 92A, 94A may be, for example, copper. The metal layers 92A, 94A each have a first terminal end terminating at a first plane XX and a second terminal end terminating at a second plane YY. Similarly, the projections of the rectangular areas 92 and 94, FIG. 1, in the metal lower (M1) layer 12 shown in FIG. 2, comprise rectangular metal layers 92A, 94A, which are positioned directly below rectangular metal layers 192A and 194A, respectively in the upper metal layer (M2), FIG. 3. As shown in FIGS. 1-4, a plurality of vias 40 extend between rectangular metal layers 92A and 192A and also between 94A and 194A, such that the metal structure in the dummy metal line region 24 mirrors the metal structure in the dummy metal line region 26. The dummy metal line regions 24, 26 are not electrically connected to metal layers in the interdigitated capacitor region 22. As is known in the art, the purpose of such mirrored dummy metal line regions are to provide precise linear shapes to the outer capacitive fingers, e.g. 54 and 74 in FIGS. 2 and 182 and 162 in FIG. 3. Unless dummy metal layers are formed at the same time as the capacitive fingers, the outer fingers are often malformed, as is known in the art. The identical construction of the dummy metal layers on each side of the capacitors also prevents the lines of magnetic flux in the interdigitated capacitor region 22 from becoming skewed.

Figure 4:
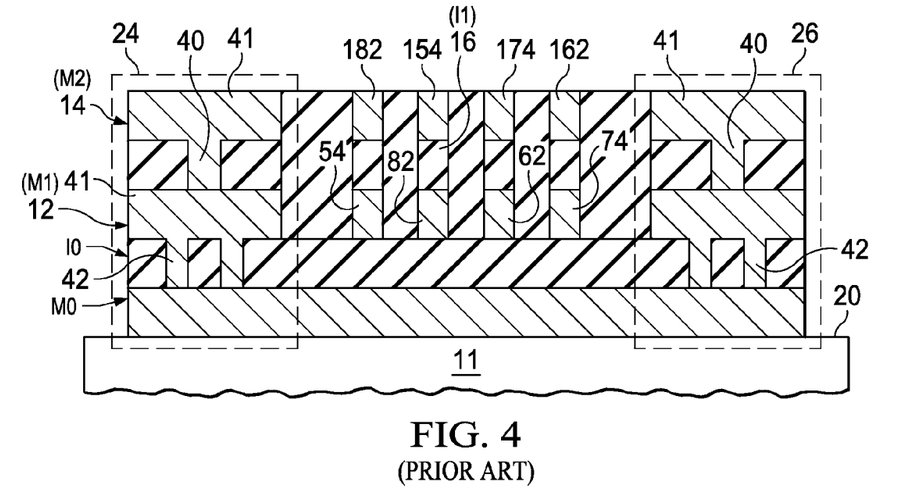
FIG. 4 is a lateral cross sectional elevation view, taken at cutting plane AA, of FIG. 1.
Figure 5:
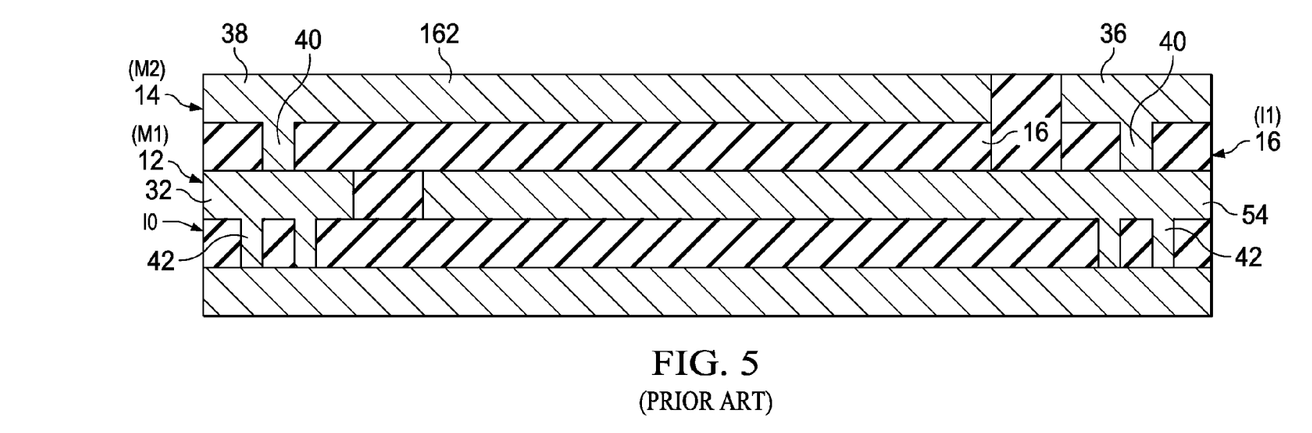
FIG. 5 is a longitudinal cross sectional elevation view, taken at cutting plane BB, of FIG. 1.
Figure 6:
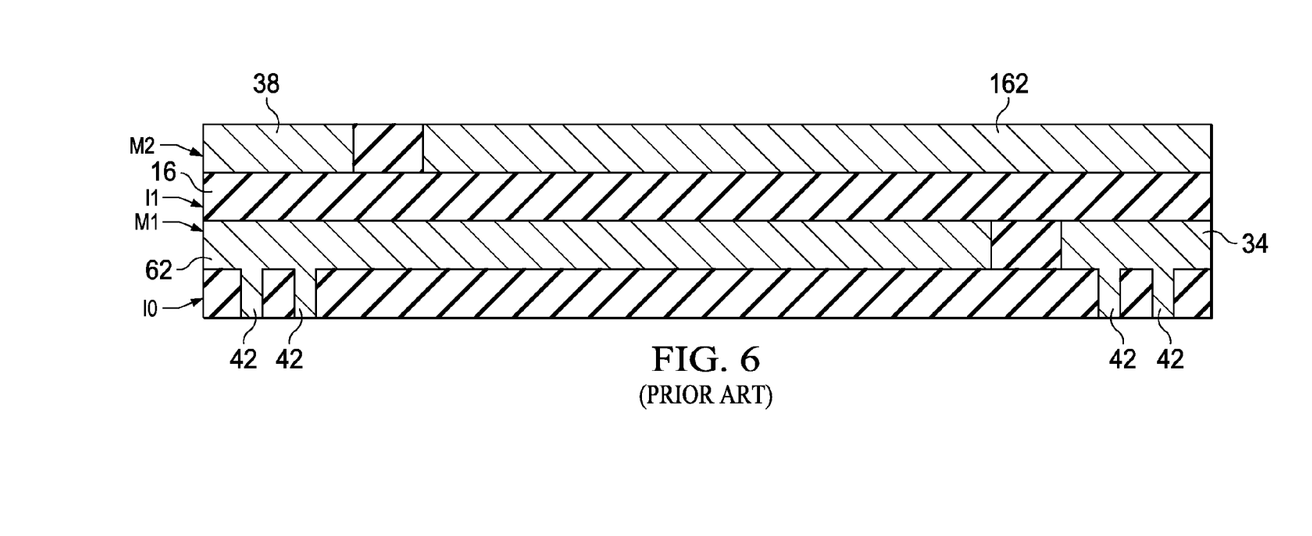
FIG. 6 is a longitudinal cross sectional elevation view, taken at cutting plane CC, of FIG. 1.

As best shown by FIG. 4 a bottom or zero metal layer M0 is formed on a top surface 20 of the semiconductor die 11. A bottom insulating layer 10 is formed on the bottom metal layer M0. The first (or lower) metal layer M1 is formed on the bottom insulating layer 10. The second or upper insulating layer 12 is formed over the M1 metal layer. The second metal layer M2 is formed on the first insulating layer I1. In the dummy metal line regions 24, 26 vias 42 electrically connect the lower metal layer M1 with the bottom metal layer M0.

FIG. 2 is a top plan view of the M1 (first or lower) metal layer 12 of the lateral flux capacitor structure 10 of FIG. 1. The M1 metal layer 12 is formed over a top surface 48 of the zero insulating layer 10.

As shown by FIG. 2, a first capacitor pattern 50 includes the tab 36, briefly described above. The tab 36 has two vias 40 extending therethrough which connect tab 36 to overlying tab 136 in the M2 layer 14 shown in FIG. 3. As further shown in FIG. 2, a first finger 54 having a proximal end 56 and a distal end 58 extends longitudinally inwardly from the tab 36, i.e. towards tab 38. A second finger 62 having a proximal end 64 and a distal end 66 also extends from the tab 36 parallel to finger 54. The distal ends 58, 66 of both fingers 54, 62 terminate at the same predetermined distance from the second tab 38A, at a plane XX that also passes through a terminal end of each of the dummy metal line rectangular layers, 92A, 94A As further shown by FIG. 2, a second capacitor pattern 70 includes the tab 38. The tab 38 has two vias 40 extending therethrough which connect tab 38 to overlying tab 138 in the M2 layer 14 shown in FIG. 3. A first finger 74 having a proximal end 76 and a distal end 78 extends longitudinally inwardly from the tab 38, i.e. towards tab 36. A second finger 82 having a proximal end 84 and a distal end 86 also extends from the tab 38 parallel to finger 74. The distal ends 78, 86 of both fingers 74, 82 terminate at the same predetermined distance from the first tab 36A at a plane YY that also passes through a terminal end of each of the dummy metal line rectangular layers 92A, 94A.

The M2 layer 14, as illustrated by FIG. 3, has a structure that is similar to that of the M1 layer 12, described above with reference to FIG. 2, except that the fingers extending from each tab are laterally offset. The lower and upper tabs 36 and 136 are connected to one pole of a power source (not shown) and the lower and upper tabs 38 and 138 are connected to the other pole of the power source. Fingers 154 and 162 project from tab 136 and fingers 174, 182 project from tab 138. Center portions of fingers 182 and 174 are positioned above and overlap with center portions of fingers 54 and 72. Center portions of fingers 154 and 162 overlap with center portions of fingers 82 and 74. The region in which the center portions of the corresponding fingers overlap is the region between planes XX and YY. This overlap region between planes XX and YY is the primary effective capacitor region of the flux capacitor structure of FIGS. 1-6.

The embodiment of the lateral flux capacitor structure shown in FIGS. 1-6 has the same footprint as the lateral flux capacitor structure shown in FIGS. 7-14. However, because of the novel configuration of the lateral flux capacitor structure of FIGS. 7-14, it has a much larger total area in which the upper capacitor portions overlap the lower capacitor portions and is thus capable of storing a greater amount of energy.

Figure 7:
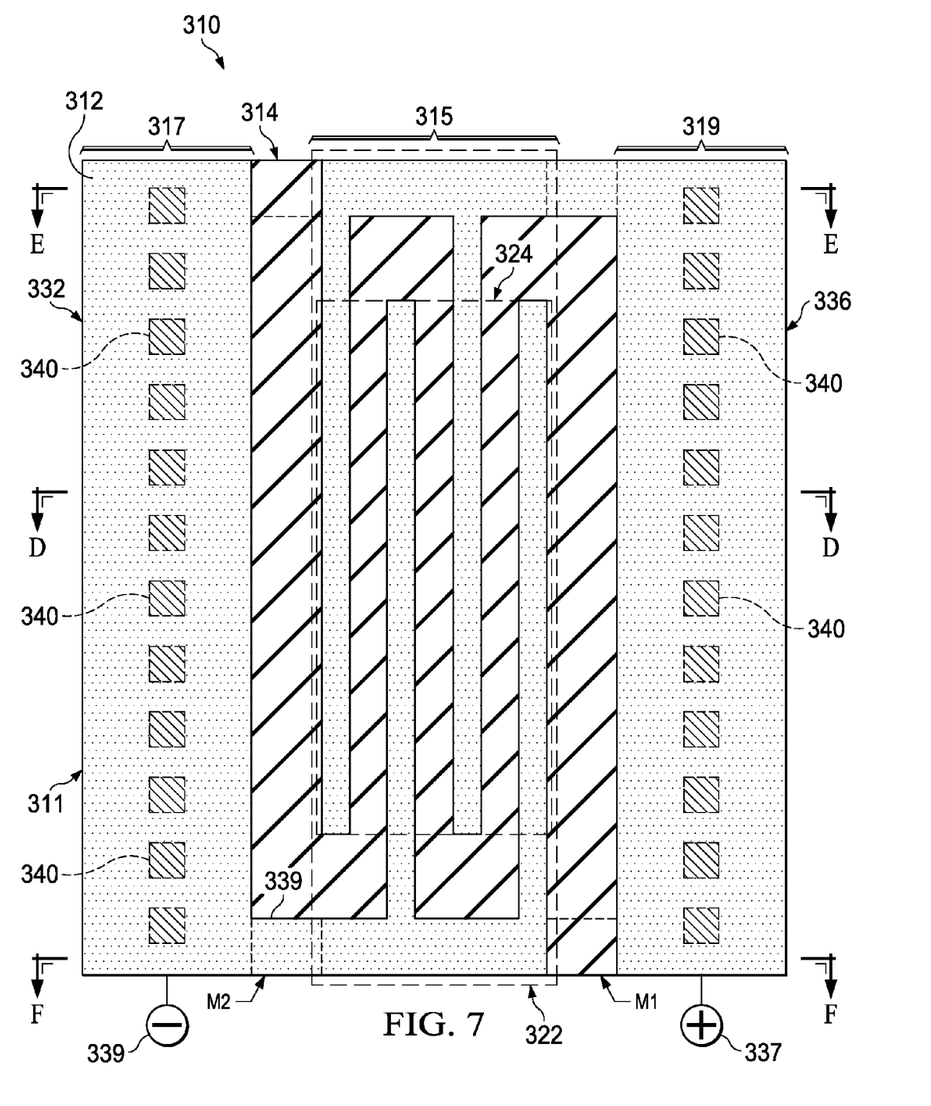
FIG. 7 is a top plan view of an example embodiment of a new lateral flux capacitor structure of an integrated circuit die.

FIG. 7 is a top plan view of an example embodiment of a new lateral flux capacitor assembly 310 provided on a semiconductor die 311 that has a top surface 312. The capacitor assembly 310 may, for purposes of description, be divided laterally into central interdigitated capacitor region 315, a first dummy metal lines region 317 on one lateral side of the capacitor region 315 and a second dummy metal lines region 319 on the other lateral side of the capacitor region 315. The width and length of the interdigitated capacitor region 315 may be approximately the same size as that of the prior art lateral flux capacitor. assembly 10. Also, the width of the dummy metal line regions 332 and 336 may be the same as that of the dummy regions of the lateral flux capacitor assembly 10 of FIG. 1.

The capacitor assembly 310, FIG. 7, has, in the central interdigitated capacitor region 315, a capacitor core area 322, which defines its effective capacitor area. This core area 322 is where both capacitive fingers and associated "hand" portions from which the fingers extend are positioned one above the other in vertically aligned relationship. The relative size of the corresponding effective capacitance area or core area 34 of the prior art lateral flex capacitor assembly 10 of FIG. 1 having the same overall length and width as that of the capacitor assembly 310 is shown in dashed lines at 324. Because of its relatively larger overlap in opposite polarity structure, the core area 322 of the new capacitor assembly 310 has a higher capacitance per unit area than the core area 34 of the prior art design of FIG. 1.

Figure 8:
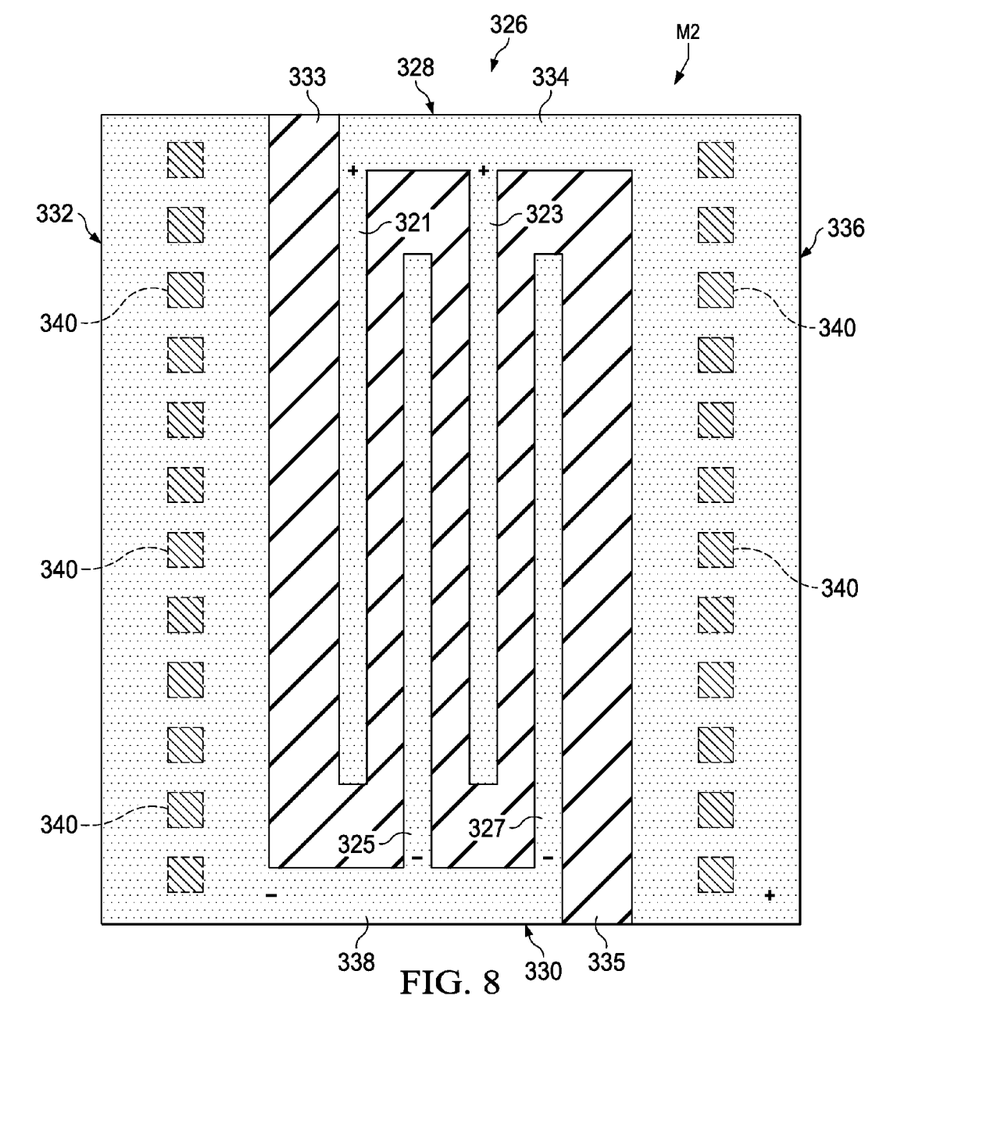
FIG. 8 is a top plan view of a top metal layer (M2) of the lateral flux capacitor structure of FIG. 7.
Figure 9:
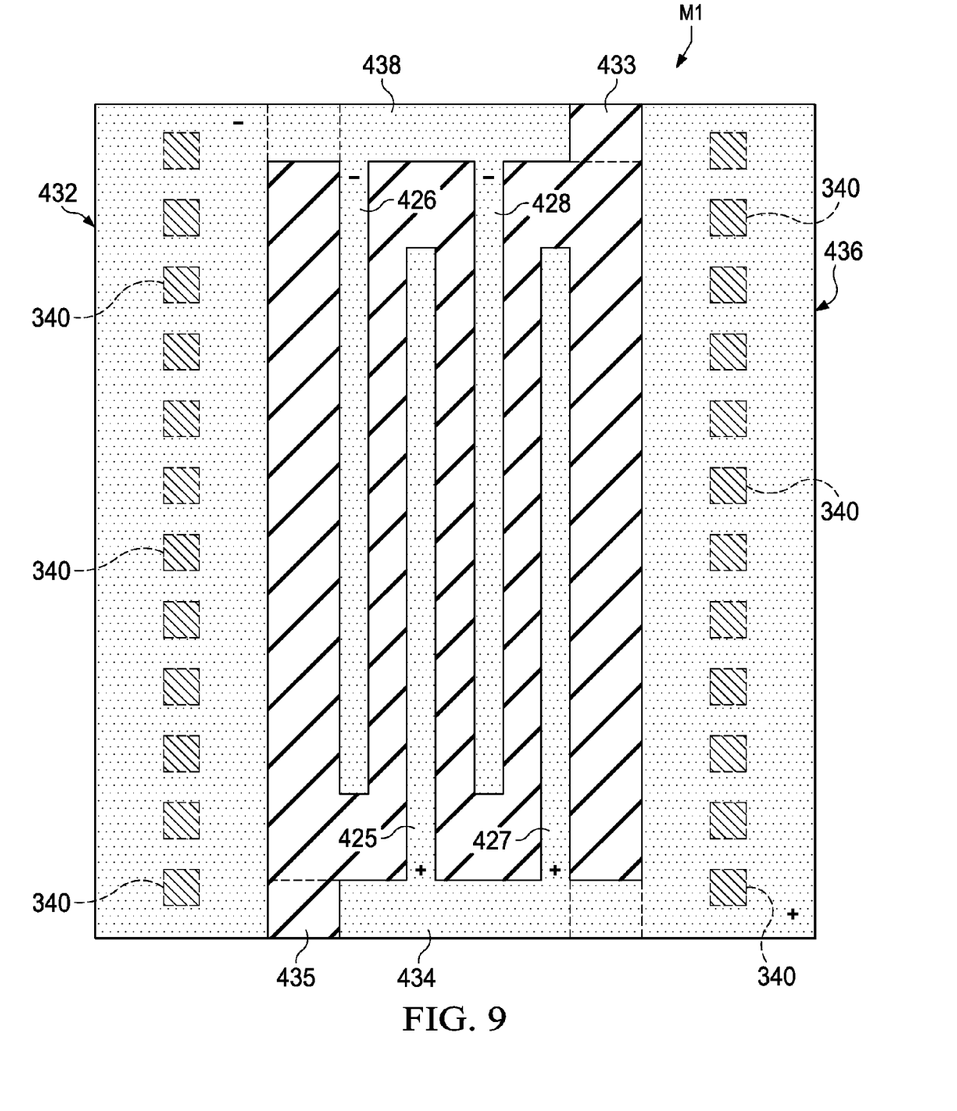
FIG. 9 is a top plan view of a bottom metal layer (M1) of the lateral flux capacitor structure of FIG. 7.
Figure 10:
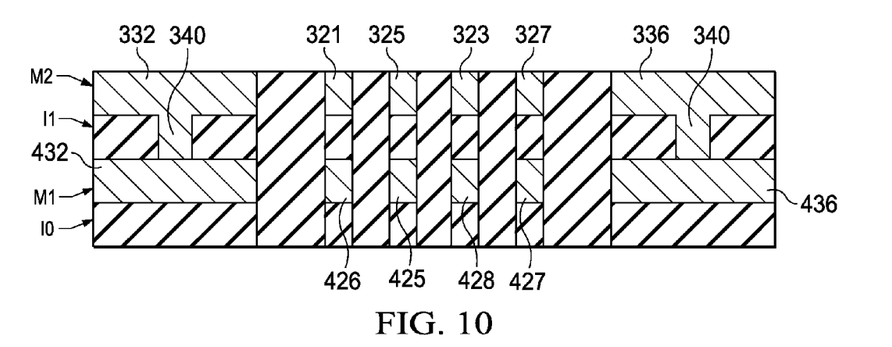
FIG. 10 is a lateral cross sectional elevation view taken at cutting plane DD of the lateral flux capacitor structure of FIG. 7.
Figure 11:
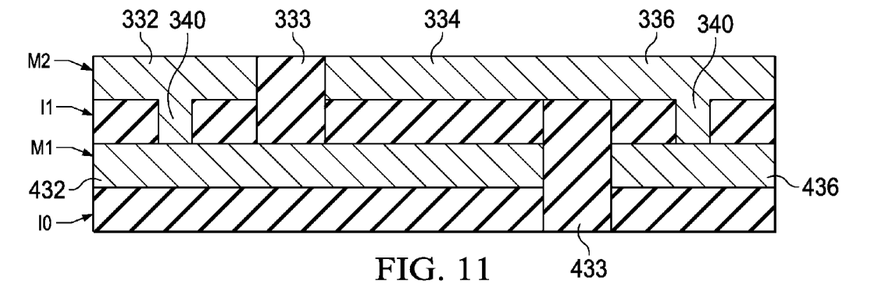
FIG. 11 is a lateral cross sectional elevation view taken at cutting plane EE of the lateral flux capacitor structure of FIG. 7.
Figure 12:
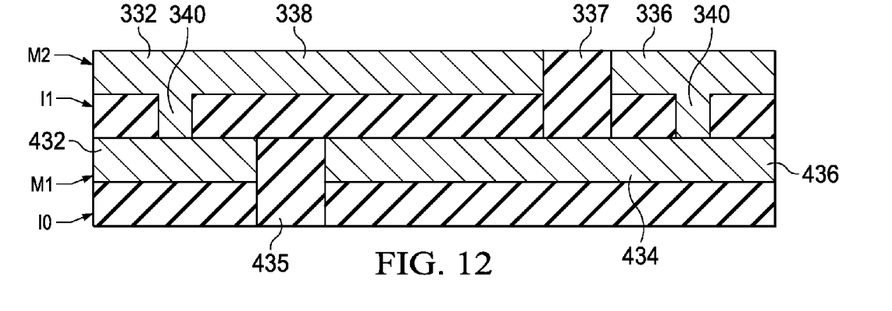
FIG. 12 is a lateral cross sectional elevation view at cutting plane FF of the lateral flux capacitor structure of FIG. 7.

The capacitor assembly 310 will now be further described with reference to FIGS. 8-10. FIG. 8 is a top view of the M2 layer and FIG. 9 is a top view of the M1 layer. (As with the M1 and M2 layers described with reference to FIGS. 1-6, it is to be understood that each "metal layer" contains a metal pattern with a surrounding pattern of dielectric material filling in the space in the layer that is not occupied by the metal pattern.) FIGS. 10-12 are cross sectional elevation views taken at sections DD, EE and FF, respectively, of FIG. 7. As best shown in FIG. 8, the top metal layer M2, has a first dummy metal line portion 332 having an elongate rectangular shape. The top metal layer M2 also has a second dummy metal line portion 336, which may be identical in size and shape to the first dummy metal line portion 332. The second dummy metal line portion 336 is positioned in lateral alignment with the first dummy metal line portion 332, i.e., the two dummy metal line portions are longitudinally coextensive As further shown by FIG. 8, an interdigitated capacitor portion 326 is positioned between the first and second dummy metal line portions 332, 336. The overall width and overall length of the two dummy metal line portions 332, 336 and the capacitor portion 326 of capacitor 310 are the same as that of the overall length and width of the rectangular region containing the two dummy metal line portions, capacitor portion and the tab portions of the prior art capacitor 10 of FIG. 1. The interdigitated capacitor portion 326 includes a first section 328 and a second section 330. The first section 328 has a laterally extending first hand portion 334, which is connected at one lateral end thereof with a first longitudinal end of the second dummy metal line portion 336. A second lateral end of the first hand portion 334 is separated from a first longitudinal end of the first dummy metal line portion 332 by a gap 333. Parallel fingers 321, 323 project longitudinally from the first hand portion 334.

With continued reference to FIG. 8, the second section 330 of the interdigitated capacitor portion 326 has a second laterally extending hand portion 338, which is connected at one lateral end thereof with a second longitudinal end of the first dummy metal line portion 332. The opposite lateral end of the second hand portion 338 is separated from a second longitudinal end of the second dummy metal line portion 332 by a gap 335. Parallel fingers 325, 327 project longitudinally from the second hand portion 338. Fingers 325, 327 are interlaced or "interdigitated" with fingers 321, 323.

Each of the dummy metal line portions 332, 336 comprise a plurality of filled vias 340 which connect them with the corresponding dummy metal line portion in the M1 layer.

As illustrated by FIGS. 8 and 9 the first metal layer M1, FIG. 9, may be identical to the second metal layer M2, FIG. 8, except for the position of gaps between dummy metal line portions and hand portions. The first metal layer includes first and second longitudinally extending dummy metal line portions 432, 436, which have the same size and shape and which are positioned directly below dummy metal line portions 332, 336 in the M2 layer.

The first hand portion 438 of the M2 layer is positioned above the first hand portion of the M1 layer, except that the first hand portion of the M1 layer is connected to the first end of the first dummy metal line portion 432 and is separated from the second dummy metal line portion 436 by a gap 433. Similarly the second hand portion 434 in the M1 layer is connected at one lateral end to the second dummy metal line portion 436 and is separated by a gap 435 from the first dummy metal line portion 432. Thus, the first and second layers M1 and M2 are identical, except for the positions of gaps 333, 335, 433, 435. Vias 340 extend between the first and second layers M1, M2 and electrically connect the M1 and M2 metal layers of each of the dummy metal lines portions.

The arrangement of various metal layers and insulating layers of the lateral flux capacitor assembly 310 are further illustrated in the cross sectional views of FIGS. 10-12.

The interconnected first dummy metal line portions 332, 432 of the M2 and M1 layers are connected to a first pole (e.g. cathode) 337 of a power source. The second dummy metal line portions 336, 436 of the M2 and M1 layers are similarly connected by vias 340, and these dummy metal line portions 336, 436 are electrically connected to a second pole (e.g. anode) 337 of the power source. As best shown by FIG. 8, in the M2 layer, the first laterally extending hand portion 338 is integrally attached to the first dummy metal lines portion 332. The first dummy metal line portion 332 in the M2 layer is electrically connected to the first dummy metal line portion 432 in the M1 layer, shown in FIG. 9, by vias 340. Thus, the first dummy metal line portions 332, 432 are electrically connected and have the same polarity (negative). The hand portion 338 and associated fingers 325 and 327 of the M2 layer are connected to the hand portion 438 and associated fingers 426, 428 of the M1 layer and all have a first (negative) polarity. Similarly the hand portions 334 and 434 of the M2 and M1 layers and their associated fingers 321, 323 and 425, 427 are connected and all have a second (positive) polarity.

Thus, all fingers of metal layer M2 have a polarity opposite from the fingers of metal layer M1 that they overlie. For example, finger 321 has a polarity the same as the second dummy metal line regions 336 and 436. Finger 321 overlies finger 426, which has the opposite polarity because it is electrically connected to the first dummy metal line portions 332, 432. It is to be noted that the length of this finger overlap is the full length of each finger, i.e. from its tip up to the point of connection with the associated hand portion.

In addition to the finger overlap, the part of the M2 layer hand portion 334 that overlies the M1 layer hand portion 438, are also of opposite polarity and thus increase the total capacitance of the assembly. The same is true of hand portions 338 and 434. Therefore, the partially overlying hand portions 338, 434 and 334, 438 provide capacitance in addition to the capacitance provided by the full length overlap of overlying fingers.

Thus, the capacitor structure of FIGS. 7-12 has been simplified with respect to that of the prior art by eliminating the prior art tab structures. The function of electrically connecting fingers to a power source, in the embodiments of FIGS. 7-12, is performed by the dummy metal line regions and hand portions. In the prior art, dummy metal line regions performed no electrical connection function. This new structure optimizes the capacitance provided within any given footprint by increasing the overlap length of each finger and by the addition of capacitance associated with partially overlapping hand portions.

Figure 13:
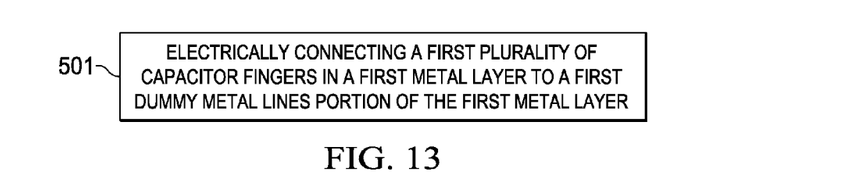
FIG. 13 is a block diagram of method of making a lateral flux capacitor.

FIG. 13 illustrates one embodiment of a method of making a lateral flux capacitor. The method includes, as shown at 601, electrically connecting a first plurality of capacitive fingers in a first metal layer to a first dummy metal lines portion of the first metal layer.

In another embodiment the method also comprises connecting a second plurality of capacitive fingers that are interdigitated with said first plurality of capacitive fingers in the one metal layer to a second dummy metal lines portion of the first metal layer.

In yet another embodiment a method of making a lateral flux capacitor includes connecting a first plurality of capacitive fingers in a second metal layer to a first dummy metal lines portion of the second metal layer and connecting a second plurality of capacitive fingers that are interdigitated with said first plurality of capacitive fingers in the second metal layer to a second dummy metal lines portion of the second metal layer; and electrically connecting the first dummy metal lines portion of the first metal layer to the first dummy metal lines portion of the second metal layer and electrically connecting the second dummy metal lines portion of the first metal layer to the second dummy metal lines portion of the second metal layer In still another embodiment a method of making a lateral flux capacitor includes electrically connecting one of the first dummy metal lines portions to one pole of a power source and electrically connecting one of the second dummy metal lines portions to the other pole of the power source.

In still yet another embodiment a method of making a lateral flux capacitor includes overlying the full length of one set of parallel capacitive fingers in the first metal layer with the full length of an identical set of parallel capacitive fingers in the second metal layer.

Certain embodiments of an integrated circuit that includes a lateral flux capacitor assembly and methods of making an integrated circuit that includes a lateral flux capacitor assembly have been described in detail herein. Alternative embodiments of lateral flux capacitor assemblies and method of making such capacitor assemblies will occur to those skilled in the art after reading this disclosure. It is intended that the claims be broadly construed to cover such alternative embodiments, except as limited by the prior art.

What is claimed is:

1. An integrated circuit comprising:
   a lateral flux capacitor having:
      an elongate capacitive portion having a lower metal layer with a first set of spaced apart capacitive fingers and an upper metal layer with a second set of spaced apart capacitive fingers positioned directly above corresponding ones of said first set of spaced apart capacitive fingers; and
      first and second elongate dummy metal line portions positioned on opposite lateral sides of said elongate capacitive portion, said first elongate dummy metal line portion being electrically connected to a first pole of a power source and said first set of capacitive fingers and said second elongate dummy metal line portion being electrically connected to a second pole of a power source and said second set of capacitive fingers.

2. The integrated circuit of claim 1, wherein the lateral flux capacitor further comprises:
   a first laterally extending hand portion located in said lower layer connecting said first set of spaced apart capacitive fingers to said first elongate dummy metal line portion; and
   a second laterally extending hand portion located in said upper layer and connecting said second set of spaced apart capacitive fingers to said second elongate dummy metal line portion.

3. The integrated circuit of claim 2, wherein said lateral flux capacitor further comprises:
   a third laterally extending hand portion located in said first layer and connecting a third set of spaced apart capacitive fingers to said second elongate dummy metal lines portion; and
   a fourth laterally extending hand portion located in said second layer and connecting a fourth set of spaced apart capacitive fingers to said first elongate dummy metal lines portion, said third set of spaced apart capacitive fingers being positioned above corresponding ones of said fourth set of spaced apart capacitive fingers.

4. The integrated circuit of claim 3, said first and third set of spaced apart capacitive fingers being interdigitated.

5. The integrated circuit of claim 4, said first and second hand portions being positioned in partially overlapping relationship and said third and fourth hand portions being positioned in partially overlapping relationship.

6. The integrated circuit of claim 5, said first and second elongate dummy metal lines portions and said elongate capacitive portion being substantially longitudinally coextensive and have laterally aligned first end portions and laterally aligned second end portions; and wherein said first hand portion is connected to said first end of said first elongate dummy metal line portion and said third hand portion is connected to said second end of said second elongate dummy metal line portion.

7. The integrated circuit of claim 6 wherein said second hand portion is connected to said first end of said second elongate dummy metal line portion and said fourth hand portion is connected to said second end of said first dummy metal line portion.

8. The integrated circuit of claim 7, said second and fourth sets of capacitive fingers being interdigitated.

9. The integrated circuit of claim 1, said first and second elongate dummy metal lines portions and said elongate capacitive portion being substantially longitudinally coextensive.

10. The integrated circuit of claim 1, said first and second elongate dummy metal lines portions each comprising an upper portion that is part of said upper metal layer and a lower portion that is part of said lower metal layer.

11. The integrated circuit of claim 10, said upper and lower portions of said first dummy metal line portion being electrically connect by vias.

12. The integrated circuit of claim 1, said first and second sets of capacitive fingers being separated by corresponding portions of an insulation layer.

* * * * *